United States Patent [19]
Yamakoshi et al.

[11] Patent Number: 6,153,315
[45] Date of Patent: Nov. 28, 2000

[54] SPUTTERING TARGET AND METHOD FOR MANUFACTURING THEREOF

[75] Inventors: Yasuhiro Yamakoshi; Hirohito Miyashita; Kazuhiro Seki, all of Kitaibaraki, Japan

[73] Assignee: Japan Energy Corporation, Tokyo, Japan

[21] Appl. No.: 09/060,209

[22] Filed: Apr. 14, 1998

[30] Foreign Application Priority Data

Apr. 15, 1997 [JP] Japan .................................. 9-111824
Mar. 4, 1998 [JP] Japan ................................ 10-067668

[51] Int. Cl.$^7$ ................................................. C23C 14/34
[52] U.S. Cl. ............... 428/687; 204/192.15; 204/298.12; 204/298.13
[58] Field of Search ....................... 428/687; 204/192.15, 204/298.13, 298.12

[56] References Cited

U.S. PATENT DOCUMENTS

| | | | |
|---|---|---|---|
| 4,663,120 | 5/1987 | Parent et al. | 419/10 |
| 4,750,932 | 6/1988 | Parent et al. | 75/228 |
| 5,294,321 | 3/1994 | Satou et al. | 204/298.13 |
| 5,409,517 | 4/1995 | Satou et al. | 75/228 |
| 5,418,071 | 5/1995 | Satou et al. | 428/552 |
| 5,460,793 | 10/1995 | Kano et al. | 433/344 |
| 5,464,520 | 11/1995 | Kano et al. | 204/298.13 |
| 5,630,918 | 5/1997 | Takahara et al. | 204/298.13 |
| 5,887,481 | 3/1999 | Leroy et al. | 73/866 |

FOREIGN PATENT DOCUMENTS 3-257158  11/1991  Japan .

OTHER PUBLICATIONS

English Abstract of the Japanese publication No. 03–257158 (Derwent) (no date).
English Abstract of the Japanese publication No. 03–257158 (Dialog) (no date).
Ishigami et al., "High Purity Ti Sputter Target for VLSIs", Toshiba Review, No. 161, pp. 38–41, Autumn 1987.
A. Abel et al., "Preparation and Characterization of Pure Metals", Metals Handbook, 10$^{th}$ Edition, vol. 2, pp. 1095–1097, 1990 (no month).

*Primary Examiner*—John J. Zimmerman
*Attorney, Agent, or Firm*—Howson and Howson

[57] ABSTRACT

The surface roughness of a sputtering target is controlled and the amount of residual contaminants, the hydrogen content, and the thickness of a surface damage layer are reduced, in order to homogenize the thickness of a film formed on a substrate by sputtering and prevent and suppress nodule production to reduce particle production during sputtering. A sputtering target with the surface roughness (Ra) not more than 1.0 $\mu$m, the total amount of contaminants, metal elements with a high melting point other than the major component and alloy components and Si, Al, Co, Ni, and B, not more that 500 ppm, the hydrogen content of the surface not more than 50 ppm, and the thickness of a surface damage layer not more than 50 $\mu$m is provided, which is manufactured by precision machining, preferably, with the use of a diamond turning tool.

8 Claims, No Drawings

SPUTTERING TARGET AND METHOD FOR MANUFACTURING THEREOF

FIELD OF THE INVENTION

The present invention relates to a target formed on a substrate by sputtering, and more particularly, the present invention relates to a sputtering target and a method of manufacturing a sputtering target which provides excellent uniformity in film thickness and low incidence of occurrence of nodules and particles.

DESCRIPTION OF THE PRIOR ART

In recent years, a sputtering method using a sputtering target has been widely employed for forming thin semiconductor films and the like.

This sputtering method forms thin films by impinging charged particles against a sputtering target, expelling particles of a substance constituting the sputtering target therefrom with the impinging force, and depositing these particles on a base material (substrate) such as a wafer placed facing the target.

One of the problems with the thin films formed by this sputtering method is that the thickness of the film is often formed uneven. It has not been clearly known that the problem of uneven film thickness is attributable to the conditions of the target surface, and no specific measures to solve the problem have been available.

In addition, during formation of a film by sputtering as described above, protrusions of sizes ranging from several micrometers to several millimeters, called nodules, may be produced in the eroded area of the sputtering target. These nodules cause a problem when they are broken by the impingement of charged particles, thereby forming particles on the substrate during sputtering.

This production of particles increases as the number of nodules on the eroded area of the sputtering target increases. The prevention of nodule production is thus a significant problem which must be addressed in order to reduce the number of problematic particles.

Under the recent situations in which LSI semiconductor devices have been highly integrated (4M bits, 16M bits, 64M bits, etc.) and wiring width has been reduced to 1 $\mu$m or less, the above-mentioned production of particles from nodules is considered to be a critical problem.

Specifically, these particles deposit directly on the thin film formed on the substrate, or they deposit and accumulate on the surrounding wall or parts of the sputtering apparatus. The deposits then peel off and re-deposit on the thin film to cause serious problems such as breaking of wires and short-circuiting. Thus, the depositing of unwanted particles has become a significant problem as electronic device circuits have become more highly integrated and finer.

Various efforts have been made to control operating conditions of sputtering and improve magnets in order to reduce these nodules. Since the cause of nodule production has not been clearly understood, however, targets designed to prevent nodule production have not been known.

OBJECT OF THE INVENTION

Therefore, an object of the present invention is to improve the thickness uniformity of a thin film formed by sputtering.

Another object of the present invention is to prevent nodule production during sputtering of a target.

A further object of the present invention is to suppress particle production during sputtering.

SUMMARY OF THE INVENTION

According to one aspect of the present invention, a sputtering target is provided having a surface which is to be eroded and which has a surface roughness in terms of center line average roughness (Ra) of 1.0 $\mu$m or less. Preferably, the surface has a surface damage layer with a thickness of 50 $\mu$m or less. Alternatively, the surface can have a roughness of 0.2 $\mu$m or less and a surface damage layer thickness of 15 $\mu$m or less.

Preferably, the total amount of contaminants which are deposited on the surface of the sputtering target is 500 ppm or less, or alternatively, 300 ppm or less. Also, preferably the surface has a hydrogen content of 50 ppm or less, or alternatively, 30 ppm or less.

According to another aspect of the present invention, a method is provided for manufacturing a sputtering target including the step of finishing a surface of the sputtering target by precision machining the surface with a diamond turning tool. Preferably, the surface is polished after being machined.

DETAILED DESCRIPTION OF THE PREFERRED EMBODIMENTS

In order to achieve the above and other objects, the inventors of the present invention devoted themselves in research and obtained the following results.

The inventors recovered a sputtering target during use and examined it in detail. As a result, it was found that uniformity of film thickness is largely affected by surface conditions of the target and can be improved by controlling target surface roughness. It was also determined that nodules are apt to be produced on an uneven part of a sputtering target surface to be eroded and that the number of produced nodules is reduced as the surface roughness of the sputtering target surface to be eroded was made smoother.

Particles expelled form a sputtering target at a low angle are readily re-deposited on a convex part of the target, and when a re-deposition speed is faster than a speed with which a surface is eroded, particles are considered to grow as nodules. When the surface is largely uneven, it has been determined that re-deposition is apt to occur and thus nodules readily grow, leading to production of a large number of nodules.

When a sputtering target whose surface roughness had been controlled by mechanical processing, polishing, chemical etching, and the like was subjected to sputtering, the thickness of a thin film formed was more even and the number of nodules and particles were reduced. As a result of further investigation, it was determined that formation of nodules is also promoted by: residual materials from processing tools such as a turning tool which remain on a target surface due to abrasion of tools during machining; residual abrasives; and an increase in hydrogen content of the surface due to chemical etching.

The above-described residual tool materials and abrasives on a target surface induce micro-arcing (micro-discharging phenomenon) on an eroded surface, and a part of the surface is melted and coagulated to form an uneven part, which serves as a new nodule-production site. It was also found that micro-arcing itself increased the number of particles.

The residual amounts of various processing tools and abrasives were examined and it was found that, when the amounts of these contaminants were reduced as thoroughly as possible, the production of nodules was suppressed and the number of particles was also decreased.

When the hydrogen content of a target surface is high during chemical etching, sputtering in the initial stage becomes unstable to make an eroded surface rougher and promote production of nodules.

Although the Applicants can not precisely explain the hydrogen content problem, it is assumed that a trace amount of hydrogen coming out from the target surface makes plasma unstable and sputtering occurs locally so that the target surface becomes rough.

As mentioned above, in the sputtering target of the present invention, the surface roughness of a surface to be eroded is provided at 1.0 µm or less in terms of center line average roughness (Ra). The reasons for making the surface roughness of a surface to be eroded finer are as follows: evenness of film thickness is improved; nodules are produced selectively on the eroded surface only; and since, when a part to be eroded of a target surface is excessively uneven, particles expelled from a sputtering target at a low angle are apt to re-deposit on a convex part of the target to readily produce nodules, prevention of such re-deposition suppresses production of nodules, resulting in a decrease in the number of particles.

When Ra becomes 1.0 µm or less, the effects for improving the evenness of film and for preventing nodule production occur so that the number of particles is reduced.

In addition, as mentioned above, metal elements with a high melting point other than the major component and alloy components, and Si, Al, Co, Ni and B depositing on a surface to be eroded are constituents of the materials used for machining tools and abrasives and are apt to remain as contaminants upon processing the target surface. All of the stated elements are included in the contaminants. The presence of these contaminants causes the problems of inducing micro-arcing and generating an uneven part on a surface, which serves as a place for nodule production. Therefore, it is necessary to reduce these contaminants as thoroughly as possible.

According to the present invention, the amount of contaminants depositing on a surface to be eroded, such as metal elements with a high melting point other than the major component and alloy components, and Si, Al, Co, Ni, and B, should be 500 ppm or less.

If a total amount of these substances is 500 ppm or less, micro-arcing on the eroded surface is suppressed and no uneven part serving as a new place of nodule production is developed; and thus, nodule production can be prevented and appearance of particles can be suppressed.

Preferably, a total amount of metal elements with a high melting point other than the major components and alloy components, and Si, Al, Co, Ni, and B should be 300 ppm or less. Also, the prevention of nodule production can be remarkably improved by reducing the total amount of contaminants to 500 ppm or less, preferably 300 ppm or less, and decreasing the center line average roughness (Ra) to 1.0 µm or less.

The amounts of contaminants are desirably controlled by analyzing a region within about 5 µm from a surface using analytical methods such as Glow Discharge Spectrometer (GDMS).

If a surface is smoothed by chemical etching, the hydrogen content of the surface increases, a gas component then suddenly appears microscopically, and unevenness is apt to be produced on the surface during sputtering. In the sputtering target according to the present invention, however, a hydrogen content of a surface to be eroded is decreased to 50 ppm or less by controlling the conditions for chemical etching and conducting dehydrogenation treatment following chemical etching to prevent nodule production and to reduce the number of particles.

The hydrogen content of a surface can be analyzed by a comparative analysis between a surface part and a bulk part not including the surface part, etc.

A decrease of hydrogen content to 50 ppm or less enables improvement of the effect of preventing nodule production.

The effect of preventing nodule production is further improved by decreasing the hydrogen content of a surface to be eroded to 50 ppm or less, preferably 30 ppm or less, decreasing a total amount of contaminants to 500 ppm or less, preferably 300 ppm or less, and reducing the center line average roughness (Ra) to 1.0 µm or less.

In manufacturing a sputtering target, machining, polishing, chemical etching, etc. are generally used to smooth a surface for controlling surface roughness. Nodule production can be effectively prevented by specifying a total amount of contaminants and a hydrogen content as described above through the selection and device of these processing methods and surface treatments, as well as controlling center line average roughness (Ra).

In manufacturing a sputtering target, machining and polishing are conducted as mentioned above, and if such processing is conducted very intensely, nodule production sometimes cannot be prevented even by controlling surface roughness. Although the reason is not necessarily clear, it is assumed that intense processing disturbs atomic arrangement and an angle of particles expelled upon sputtering is made to decrease; and therefore, deposition occurs more easily even with less surface roughness, that is, on a less uneven surface.

Therefore, it is necessary to reduce the thickness of the surface damage layer of a surface to be eroded of the sputtering target to 50 µm or less. A term "surface damage layer" used herein can be defined as an area where residual stress generated from processing appears. The residual stress can be measured by a residual stress measuring method using x-ray.

If processing is performed so intensely that the thickness of a surface damage layer exceeds 50 µm, no effect of reducing the number of nodules is experienced and the number of particles cannot be reduced effectively.

In addition, in the present invention, a method of manufacturing a sputtering target in which finishing of the sputtering surface is conducted by precision machining using a diamond turning tool or by precision machining using a diamond turning tool followed by polishing, if required, has been investigated.

It has been found that precision machining using a diamond turning tool can reduce surface roughness effectively without using wet polishing or chemical polishing, which have been required conventionally. In addition, by choosing this processing condition, center line average roughness (Ra) can be 0.2 µm or less and the thickness of a surface damage layer can be 15 µm or less.

When a conventional carbide tool is employed, contamination of heavy metals is necessarily apt to occur. On the other hand, when a diamond turning tool is employed, such contamination does not occur.

The present method does not require characteristically washing and dehydration treatment (required in chemical polishing) which have been required for wet polishing and chemical polishing. It is needless to say that the combined use of conventional polishing methods is allowed and can further reduce surface roughness and the thickness of a surface damage layer.

Since the quality of a film exhibited dispersions immediately after initiation of use of a target, dummy sputtering is carried out until film formation is stabilized.

In Table 1, a round mark means that a processing or treatment was conducted.

The target thus obtained was connected to a copper backing plate with a diameter of 348 mm and a thickness of 21.0 mm and then subjected to sputtering below.

TABLE 1

| | Material | Lathe Machining | Diamond-Finishing Machining | Wet Polishing | Chemical Polishing | Washing | Dehydrogenation Treatment |
|---|---|---|---|---|---|---|---|
| Example 1 | Ti | o | | o | | o | |
| Example 2 | Ti | o | | | o | o | o |
| Example 3 | Ti | o | | o | | o | |
| Example 4 | Ti | o | | o | | o | |
| Example 5 | Ti | o | | | o | o | o |
| Example 6 | Ti | o | | | o | o | o |
| Example 7 | Ti | o | o | | | | |
| Example 8 | Ti | o | o | o | | o | |
| Example 9 | Ti | o | o | | o | o | o |
| Comparative Example 1 | Ti | o | | | | | |
| Comparative Example 2 | Ti | o | | o | | o | |

(A round mark indicates that the associated processing or treatment was applied.)

As to sheet resistance, for example, since a target with dispersion of standard deviation of sheet resistance in a wafer during processing of about 3% is generally used, the above-mentioned dummy sputtering is carried out until dispersion of standard deviation of sheet resistance in the wafer becomes 3% or less after initiation of using the target.

This dummy sputtering has a problem. For targets, especially those in which surface processing status has not been controlled, cumulative input power of about 20 Kwh is generally required, resulting in large time loss in the process requiring film formation with low power.

According to the present invention, precision machining using a diamond turning tool enables manufacturing of a sputtering target wherein the surface roughness of a surface to be eroded of the sputtering target is 0.2 μm or less in terms of center line average roughness (Ra) and the thickness of a surface damage layer of the surface to be eroded is 15 μm or less as described above, and a decrease in the thickness of a surface damage layer mentioned above provides an effect to largely reduce the time required for this dummy sputtering.

EXAMPLES AND COMPARATIVE EXAMPLES

Next, the present invention will be described in detail referring to preferred embodiments and comparative examples.

Examples 1–9 and Comparative Examples 1–2

Sputtering target material composed of highly purified titanium was subjected to lathe machining. Then, a surface to be eroded was subject to diamond-finishing machining, wet polishing, chemical polishing, washing with ultra-pure water, and dehydrogenation treatment to prepare a sputtering target (300 mm in diameter and 6.35 mm in thickness) with controlled surface roughness (Ra), total amount of contaminants, hydrogen content, and thickness of a surface damage layer. These example are shown in Tables 1 and 2.

TABLE 2

| | Surface Roughness Ra(μm) | Total amount of Contaminants (ppm) | Hydrogen Content (ppm) | Thickness of Surface damage Layer (μm) |
|---|---|---|---|---|
| Example 1 | 0.8 | 280 | 10 | 40 |
| Example 2 | 0.6 | 45 | 40 | 10 |
| Example 3 | 0.9 | 120 | 10 | 10 |
| Example 4 | 0.3 | 470 | 15 | 10 |
| Example 5 | 0.2 | 60 | 10 | 8 |
| Example 6 | 0.08 | 40 | 10 | 6 |
| Example 7 | 0.17 | 80 | 8 | 11 |
| Example 8 | 0.13 | 100 | 10 | 7 |
| Example 9 | 0.07 | 40 | 8 | 5 |
| Comparative Example 1 | 1.8 | 670 | 15 | 70 |
| Comparative Example 2 | 3.0 | 450 | 10 | 30 |

The sputtering target thus prepared was set in a DC magnetron sputtering apparatus and sputtering was carried out under a nitrogen atmosphere to form a TiN film on a silicon wafer. The number of nodules, average particle number, and standard deviation of sheet resistance ($\phi 8''$) in a wafer at the time of cumulative input power after initiation of use being 10 Kwh were examined for Examples 1–9 and Comparative Examples 1–2. The results are shown in Table 3.

TABLE 3

| | Number of Nodules (No./target) | Average Particle No. (No./wafer) | Standard Deviation of sheet resistance (Percent) |
|---|---|---|---|
| Example 1 | 57 | 31 | 3.6 |
| Example 2 | 23 | 20 | 2.4 |
| Example 3 | 41 | 26 | 2.6 |
| Example 4 | 71 | 33 | 3.3 |
| Example 5 | 30 | 26 | 2.4 |
| Example 6 | 30 | 26 | 2.3 |
| Example 7 | 32 | 28 | 2.5 |

TABLE 3-continued

|  | Number of Nodules (No./target) | Average Particle No. (No./wafer) | Standard Deviation of sheet resistance (Percent) |
|---|---|---|---|
| Example 8 | 31 | 25 | 2.3 |
| Example 9 | 20 | 21 | 2.1 |
| Comparative Example 1 | 500 | 110 | 4.8 |
| Comparative Example 2 | 500 | 87 | 3.2 |

As shown in Table 2, the center line average roughness, Ra was 1.0 μm, the upper limit, or less in Examples 1–9 according to the present invention, whereas the center line average roughness was 1.8 μm for Comparative Example 1 and 3.0 μm for Comparative Example 2, which exceed the above-mentioned upper limit.

In addition, the total amount of contaminants depositing on the surface to be eroded, that is, metal elements with a high melting point other than the major component and alloy components (W, Ta, Mo, Nb, and the like), and Si, Al, Co, Ni, and B was 500 ppm or less, that is, in a range of 40 ppm and 470 ppm for Examples 1–9, whereas the total amounts were 670 ppm and 450 ppm for Comparative Examples 1 and 2, respectively, which values exceed the upper limit of 500 ppm or were close to it.

The hydrogen content of the surface ranged from 8 ppm to 40 ppm in Examples 1–9. The contents were 15 ppm and 10 ppm for Comparative Examples 1 and 2, respectively.

The thickness of the surface damage layer of the surface was 5–40 μm for Examples 1–9, while is was 70 μm for Comparative Example 1 and 30 μm for Comparative Example 2, which exceeded the upper limit of 50 μm or was relatively large.

As shown from a comparison between Tables 2 and 3, the number of nodules and average particle number were small and the standard deviation of sheet resistance in the wafer was small for Examples 1–9 according to the present invention, in which none of: the center line average roughness; total amount of contaminants depositing on the surface to be eroded, metal elements with a high melting point other than the major component and alloy components (W, Ta, Mo, Nb and the like) and Si, Al, Co, Ni, and B; hydrogen content; or thickness of the surface damage layer of the surface, exceeded the respective upper limits, indicating that good sputtering targets were obtained.

However, in Examples 1 and 4, in which one or more of surface roughness, amount of contaminants, hydrogen content, and thickness of the surface damage layer exhibited values close to the upper limits, the number of nodules and the average particle number tended to relatively increase and the standard deviation of sheet resistance in a wafer was slightly high. Consequently, it is shown that these increases affect the properties of sputtering targets.

In Examples 7–9 in which diamond-finishing machining was preformed, the center line average roughness (Ra) was 0.07–0.17 μm, the amount of contaminants was 40–100 ppm, and the thickness of the surface damage layer was 5–11 μm, and thus the center line average roughness (Ra) and the thickness of the surface damage layer exhibited remarkably low values.

In addition, in this case, the numbers of nodules produced and average particle number were small and the standard deviation of sheet resistance in a wafer at the time of cumulative input power after initiation of use being 10 kWh was constantly low, 2.1–2.5%.

From above, the diamond-finishing machining is found to provide an excellent result.

In Examples 8 and 9, as shown in Table 1, in addition to diamond-finishing machining, wet polishing and washing or chemical polishing, washing, and dehydrogenation treatments were conducted. The number of nodules and average particle number, and the standard deviation of sheet resistance in a wafer were further improved, showing excellent results.

On the contrary, in Comparative Examples 1 and 2, as shown in Table 3, the number of nodules was 500/target, the average number of appearing particles were 110 and 87/wafer, and the standard deviations of sheet resistance were 4.8% and 3.2%; all of these values were high. Comparative Example 1, in which the amount of contaminants was particularly high and the surface damage layer was thick, showed the worst results among the Comparative Examples shown in Table 3.

From the above-discussed examples, a titanium target according to the present invention is shown to be an excellent target with lower incidences of nodule production and particle production and a small standard deviation of sheet resistance in a wafer.

Examples 10–14 and Comparative Examples 3–4

Next, examples of the present invention with tantalum, Examples 10–14 and Comparative Examples 3–4, are shown.

Sputtering target material composed of highly purified tantalum (Ta) was subjected to lathe machining. Then, a surface to be eroded was subjected to diamond-finishing machining, wet polishing, chemical polishing, washing with ultra-pure water, and dehydrogenation treatment to prepare a sputtering target (300 mm in diameter and 6.35 mm in thickness) with controlled surface roughness (Ra), total amount of contaminants, hydrogen content, and thickness of a surface damage layer. They are shown in Table 4 and 5. In Tables 4, a round marks means that a processing or treatment was conducted.

The target thus obtained was connected to a copper backing plate with a diameter of 348 mm and a thickness of 21.0 mm and then subjected to sputtering below.

TABLE 4

|  | Material | Lathe Machining | Diamond-Finishing Machining | Wet Polishing | Chemical Polishing | Washing | Dehydrogenation Treatment |
|---|---|---|---|---|---|---|---|
| Example 10 | Ta | ○ |  | ○ |  | ○ |  |
| Example 11 | Ta | ○ |  |  | ○ | ○ | ○ |
| Example 12 | Ta | ○ | ○ |  |  |  |  |
| Example 13 | Ta | ○ | ○ |  | ○ | ○ |  |

TABLE 4-continued

|  | Material | Lathe Machining | Diamond-Finishing Machining | Wet Polishing | Chemical Polishing | Washing | Dehydrogenation Treatment |
|---|---|---|---|---|---|---|---|
| Example 14 | Ta | ○ | ○ |  | ○ | ○ | ○ |
| Comparative Example 3 | Ta | ○ |  |  |  |  |  |
| Comparative Example 4 | Ta | ○ |  | ○ |  | ○ |  |

(A round mark indicates that the associated processing or treatment was conducted.)

TABLE 5

|  | Surface Roughness Ra($\mu$m) | Total Amount of Contaminants (ppm) | Hydrogen Content ($\mu$m) | Thickness of Surface Damage Layer ($\mu$m) |
|---|---|---|---|---|
| Example 10 | 0.7 | 320 | 10 | 30 |
| Example 11 | 0.5 | 60 | 10 | 15 |
| Example 12 | 0.14 | 90 | 10 | 10 |
| Example 13 | 0.07 | 150 | 10 | 8 |
| Example 14 | 0.05 | 35 | 8 | 8 |
| Comparative Example 3 | 2.2 | 560 | 10 | 55 |
| Comparative Example 4 | 3.5 | 480 | 10 | 30 |

The tantalum sputtering target thus prepared was set in DC magnetron sputtering apparatus and sputtering was carried out under a nitrogen atmosphere to form a TaN film on a silicon wafer. The number of nodules, average particle number, and standard deviation of sheet resistance in a wafer at the time of cumulative input power after initiation of use being 10 kWh ($\phi$8") were examined for Examples 10–14 and Comparative Examples 3–4. The results are shown in Table 6.

TABLE 6

|  | Number of Nodules (No./target) | Average Particle No. (No./wafer) | Standard Deviation of Sheet Resistance (Percent) |
|---|---|---|---|
| Example 10 | 65 | 33 | 3.2 |
| Example 11 | 39 | 32 | 2.7 |
| Example 12 | 28 | 26 | 2.6 |
| Example 13 | 34 | 29 | 2.7 |
| Example 14 | 22 | 23 | 2.3 |
| Comparative Example 3 | 500 | 95 | 4.6 |
| Comparative Example 4 | 500 | 102 | 3.3 |

As shown in Table 5, the center line average roughness, Ra was 1.0 $\mu$m, the upper limit, or less in Examples 10–14 according to the present invention, whereas the center line average roughness was 2.2 $\mu$m for Comparative Example 3 and 3.5 $\mu$m for Comparative Example 4, which indicated rough surfaces.

In addition, the total amount of contaminants depositing on the surface to be eroded, that is, metal elements with a high melting point other than the major component and alloy components (W, Ti, Mo, Nb, and the like) and Si, Al, Co, Ni, and B, was 500 ppm or less, that is, in a range of 35 ppm and 320 ppm for Examples 10–14, whereas the total amounts were 560 ppm and 480 ppm for Comparative Examples 3 and 4, respectively, which values exceeded the upper limit of 500 ppm or were close to the upper limit.

The hydrogen content of the surface ranged from 8 ppm to 25 ppm in Examples 10–14, and 10 ppm in Comparative Examples 3 and 4.

The thickness of the surface damage layer of the surface was 8–30 $\mu$m for Examples 10–14, while it was 55 $\mu$m for Comparative Example 3 and 30 $\mu$m for Comparative Example 4, which exceeded the upper limit of 50 $\mu$m or was relatively large.

As shown from a comparison between Tables 5 and 6, the number of nodules and average particle number were small and standard deviation of sheet resistance in a wafer was small for Examples 10–14 according to the present invention, in which none of the center line average roughness; total amount of contaminants depositing on the surface to be eroded, that is, metal elements with a high melting point other than the major component and alloy components (W, Ti, Mo, Nb and the like) and Si, Al, Co, Ni, and B; hydrogen content; or thickness of the surface damage layer of the surface, exceeded the respective upper limits, indicating that good sputtering targets were obtained.

However, in Example 10, in which the amount of contaminants and the thickness of the surface damage layer exhibited slightly larger values as compared with the other Examples, the number of nodules and average particle number tended to relatively increase and the standard deviation of sheet resistance in a wafer was slightly higher as in the case of the above-mentioned TiN.

Although Example 10 is within the scope of the present invention and had no particular problem, it is shown that the increases in the amount of contaminants and thickness of a surface damage layer impose influence on the properties of sputtering targets.

In Examples 12–14 in which diamond-finishing machining was preformed, the center line average roughness (Ra) was 0.05–0.14 $\mu$m, the amount of contaminants was 35–150 ppm, and the thickness of the surface damage layer was 8–10 $\mu$m and thus the center line average roughness (Ra) and the thickness of the surface damage layer were remarkably reduced.

In addition, in this case, the number of nodules produced and average number were small and the standard deviation of sheet resistance in a wafer at the time of cumulative input power after initiation of use being 10 kWh was constantly low, 2.3–2.7%.

From above, diamond-finishing machining is found to exert quite an excellent effect as in Examples 5–7.

In Examples 13 and 14, as shown in Table 4, in addition to diamond-finishing machining, wet polishing and washing or chemical polishing, washing, and dehydrogenation treatment were conducted. The number of nodules and average particle number, and the standard deviation of sheet resistance in a wafer were further improved, showing excellent results.

On the contrary, in Comparative Examples 3 and 4, as shown in Table 6, the number of nodules was 500/target, the average numbers of appearing particles were as high as 102 and 95/wafer, and the standard deviations of sheet resistance were 4.6% and 3.3%, showing a rather bad result.

From the above, a tantalum target of the present invention is shown to be an excellent target with low incidences of nodule production and appearance of particles, and a small standard deviation of sheet resistance in a wafer.

Examples 15–20 and Comparative Examples 5–6

Next, examples of the present invention to copper, Examples 15–20 and Comparative Examples 5–6, are shown.

Sputtering target material composed of highly purified copper (Cu) was subjected to lathe machining. Then, a surface to be eroded was subjected to diamond-finishing machining, wet polishing, chemical polishing, washing with ultra-pure water, and dehydrogenation treatment to prepare a sputtering target (300 mm in diameter and 6.35 mm in thickness) with controlled surface roughness (Ra), total amount of contaminants, hydrogen content, and thickness of a surface damage layer.

These examples are shown in Tables 7 and 8. In Table 7, a round mark indicates that a processing or treatment was conducted.

The target thus obtained was connected to a copper backing plate with a diameter of 348 mm and a thickness of 21.0 mm and then subjected to sputtering below.

silicon wafer. The number of nodules, average particle number, and standard deviation of sheet resistance ($\phi 8"$) in a wafer at the time of cumulative input power after initiation of use being 10 kWh were examined for Examples 15–20 and Comparative Examples 5 and 6. The results are shown in Table 9.

TABLE 9

|  | Number of Nodules (No./target) | Average Particle No. (No./wafer) | Standard Deviation of Sheet Resistance (Percent) |
|---|---|---|---|
| Example 15 | 21 | 13 | 2.8 |
| Example 16 | 8 | 3 | 2.6 |
| Example 17 | 3 | 1 | 2.3 |
| Example 18 | 17 | 7 | 2.8 |
| Example 19 | 6 | 3 | 2.4 |
| Example 20 | 11 | 5 | 3.5 |
| Comparative Example 5 | 17 | 6 | 4.1 |
| Comparative Example 6 | 20 | 12 | 3.6 |

As shown in Table 8, the center line average roughness, Ra was 1.0 $\mu$m, the upper limit, or less in Examples 15–20 according to the present invention, whereas the center line average roughness was 2.4 $\mu$m for Comparative Example 5 and 1.6 $\mu$m for Comparative Example 6.

In addition, the total amount of contaminants depositing on a surface to be eroded, that is, metal elements with a high melting point other than the major component and alloy components (W, Ti, Ta, Mo, Nb, and the like) and Si, Al, Co,

TABLE 7

|  | Material | Lathe Machining | Diamond-Finishing Machining | Wet Polishing | Chemical Polishing | Washing | Dehydrogenation Treatment |
|---|---|---|---|---|---|---|---|
| Example 15 | Cu | ○ |  | ○ |  | ○ |  |
| Example 16 | Cu | ○ |  |  | ○ | ○ | ○ |
| Example 17 | Cu | ○ | ○ |  |  | ○ |  |
| Example 18 | Cu | ○ | ○ | ○ |  | ○ |  |
| Example 19 | Cu | ○ | ○ |  | ○ | ○ | ○ |
| Example 20 | Cu | ○ |  |  | ○ | ○ | ○ |
| Comparative Example 5 | Cu | ○ |  |  |  |  |  |
| Comparative Example 6 | Cu | ○ |  | ○ |  | ○ |  |

(A round mark indicates that the associated processing or treatment was conducted.)

TABLE 8

|  | Surface Roughness Ra($\mu$m) | Total Amount of Contaminants (ppm) | Hydrogen Content ($\mu$m) | Thickness of Surface Damage Layer ($\mu$m) |
|---|---|---|---|---|
| Example 15 | 0.8 | 360 | 10 | 10 |
| Example 16 | 0.4 | 70 | 10 | 10 |
| Example 17 | 0.11 | 60 | 1 | 4 |
| Example 18 | 0.05 | 260 | 10 | 10 |
| Example 19 | 0.03 | 45 | 20 | 6 |
| Example 20 | 0.9 | 55 | 20 | 20 |
| Comparative Example 5 | 2.4 | 60 | 2 | 35 |
| Comparative Example 6 | 1.6 | 370 | 20 | 25 |

The sputtering target thus prepared was set in a DC magnetron sputtering apparatus and sputtering was carried out under a nitrogen atmosphere to form a Cu film on a Ni, and B, was 500 ppm or less, that is, in a range of 45 ppm and 360 ppm for Examples 15–20, whereas the total amounts were 60 ppm and 370 ppm for Comparative Examples 5 and 6, respectively.

The hydrogen content of the surface ranged from 1 ppm to 20 ppm in Examples 15–20, whereas the contents were 2 ppm and 20 ppm for Comparative Examples 5 and 6, respectively.

The thickness of the surface damage layer of the surface was 4–20 $\mu$m for Examples 15–20, while is was 35 $\mu$m for Comparative Example 5 and 25 $\mu$m for Comparative Example 6, which had relatively thick surface damage layers.

As shown from a comparison between Tables 8 and 9, the number of nodules and average particle number were small and standard deviation of sheet resistance in a wafer was small for Examples 15–20 according to the present invention, in which none of center line average roughness; total amount of contaminants depositing on the surface to be eroded, that is, metal elements at a high melting point other than the major component and alloy components (W, Ti, Ta, Mo, Nb, and the like) and Si, Al, Co, Ni, and B; hydrogen content; or thickness of the surface damage layer of the surface exceeded the respective upper limits, indicating that good sputtering targets were obtained.

However, in Examples 15 and 18 in which the surface roughness was relatively large and the amount of contaminants was high, and in Example 20 for which the surface roughness was relatively large and the thickness of the surface damage layer was large, the number of nodules and average particle number tended to relatively increase and the standard deviation of sheet resistance in a wafer was slightly higher.

Although Examples 15, 18, and 20 are included in the scope of the present invention and had no particular problems, it is shown that these increases affect the properties of sputtering targets.

In Examples 17–19, in which diamond-finishing machining was preformed, the center line average roughness (Ra) was 0.03–0.11 $\mu$m and the thickness of the surface damage layer was 4–10 $\mu$m and thus the center line average roughness (Ra) and the thickness of the surface damage layer were remarkably small.

In addition, in this case, the number of nodules produced and average particle number were small and the standard deviation of sheet resistance in a wafer at the time of cumulative input power after initiation of use being 10 kWh was constantly low 2.3–2.8%.

From the above, diamond-finishing machining is found to provide an excellent result as in Examples 5–7.

For Examples 18–19, as shown in Table 7, in addition to diamond-finishing machining, wet polishing and washing or chemical polishing, washing, and dehydrogenation treatment were conducted. The number of nodules and average particle number, and the standard deviation of sheet resistance in a wafer were further improved, showing excellent results.

On the contrary, in Comparative Examples 5 and 6, as shown in Tables 8 and 9, the center line average roughness (Ra) was large and the surface damage layer was thick.

The numbers of nodules were large, 17 and 20/target, and the average numbers of appearing particles were also large, 6 and 12/wafer. The standard deviations of sheet resistance in a wafer were especially high, 3.6% and 4.1%, showing clearly bad results.

From above, a copper target of the present invention is shown to be an excellent target with lower incidences of nodule production and appearance of particles, and a small standard deviation of sheet resistance in a wafer.

Examples 21–26 and Comparative Examples 7–8

Next, examples of the present invention to aluminum, Examples 21–26 and Comparative Examples 7–8, are shown.

Sputtering target material composed of highly purified aluminum (Al) was subjected to lathe machining. Then, a surface to be eroded was subjected to diamond-finishing machining, wet polishing, chemical polishing, washing with ultra-pure water, and dehydrogenation treatment to prepare a sputtering target (300 mm in diameter and 6.35 mm in thickness) with controlled surface roughness (Ra), total amount of contaminants, hydrogen content, and thickness of a surface damage layer. These examples are shown in Tables 10 and 11. In Table 10, a round mark indicates that a processing or treatment was conducted.

The target thus obtained was connected to a copper backing plate with a diameter of 348 mm and a thickness of 21.0 mm and then subjected to sputtering below.

TABLE 10

| | Material | Lathe Machining | Diamond-Finishing Machining | Wet Polishing | Chemical Polishing | Washing | Dehydrogenation Treatment |
|---|---|---|---|---|---|---|---|
| Example 21 | Al | ○ | | ○ | | ○ | |
| Example 22 | Al | ○ | | | ○ | ○ | ○ |
| Example 23 | Al | ○ | ○ | | | | |
| Example 24 | Al | ○ | ○ | ○ | | ○ | |
| Example 25 | Al | ○ | ○ | | ○ | ○ | ○ |
| Example 26 | Al | ○ | | | ○ | ○ | ○ |
| Comparative Example 7 | Al | ○ | | | | | |
| Comparative Example 8 | Al | ○ | | ○ | | ○ | |

(A round mark indicates that the associated processing or treatment was conducted.)

TABLE 11

| | Surface Roughness Ra($\mu$m) | Total Amount of Contaminants (ppm) | Hydrogen Content ($\mu$m) | Thickness of Surface Damage Layer ($\mu$m) |
|---|---|---|---|---|
| Example 21 | 0.9 | 240 | 10 | 10 |
| Example 22 | 0.8 | 100 | 10 | 10 |
| Example 23 | 0.15 | 30 | 1 | 5 |
| Example 24 | 0.12 | 130 | 10 | 10 |
| Example 25 | 0.03 | 30 | 15 | 5 |
| Example 26 | 0.3 | 45 | 20 | 20 |
| Comparative Example 7 | 3.1 | 70 | 2 | 30 |
| Comparative Example 8 | 2.2 | 400 | 10 | 25 |

The Al sputtering target thus prepared was set in a DC magnetron sputtering apparatus and sputtering was carried out under a nitrogen atmosphere to form an Al film on a silicon wafer. The number of nodules, average particle number, and standard deviation of sheet resistance ($\phi$8") in a wafer at the time of cumulative input power after initiation of use being 10 kWh were examined for Examples 21–26 and Comparative Examples 7 and 8. The results are shown in Table 12.

TABLE 12

|  | Number of Nodules (No./target) | Average Particle No. (No./wafer) | Standard Deviation of Sheet Resistance (Percent) |
| --- | --- | --- | --- |
| Example 21 | 15 | 7 | 2.8 |
| Example 22 | 10 | 3 | 2.8 |
| Example 23 | 2 | 1 | 2.4 |
| Example 24 | 13 | 6 | 2.8 |
| Example 25 | 5 | 3 | 2.4 |
| Example 26 | 10 | 5 | 3.5 |
| Comparative Example 7 | 17 | 6 | 4.0 |
| Comparative Example 8 | 19 | 12 | 3.7 |

As shown in Table 11, the center line average roughness, Ra, was 1.0 μm, the upper limit, or less in Examples 21–26 according to the present invention, whereas it was 3.1 μm for Comparative Examples 7 and 2.2 μm for Comparative Example 8.

In addition, the total amount of contaminants depositing on a surface to be eroded, that is, metal elements with a high melting point other than the major component and alloy components (W, Ti, Ta, Mo, Nb, and the like) and Si, Al, Co, Ni, and B, was 500 ppm or less, that is, in a range of 30 ppm and 240 ppm for Examples 21–26, whereas the total amounts were 70 ppm and 400 ppm for Comparative Examples 7 and 8, respectively.

The hydrogen content of the surface ranged from 1 ppm to 20 ppm in Examples 21–26. The contents were 2 ppm and 10 ppm for Comparative Examples 7 and 8, respectively.

The thickness of the surface damage layer of the surface was 5–20 μm for Examples 21–26, while is was 30 μm for Comparative Example 7 and 25 pm for Comparative Example 8, which exhibited thick surface damage layers.

As shown from a comparison between Tables 11 and 12, the number of nodules and average particle number were small and standard deviation of sheet resistance in a wafer was small for Examples 21–26 according to the present invention, in which none of center line average roughness; total amount of contaminants depositing on a surface to be eroded, that is metal elements with a high melting point other than the major component and alloy components (W, Ti, Ta, Mo, Nb, and the like) and Si, Al, Co, Ni, and B; hydrogen content; or thickness of a surface damage layer of the surface exceeded the respective upper limits, indicating that good sputtering targets were obtained.

However, for Examples 21 and 22 in which the surface roughness was relatively high and the amount of contaminants was relatively large among Examples, it is found that the standard deviation of sheet resistance within a wafer was slightly higher. In Example 26 in which the hydrogen content and the thickness of the surface damage layer were slightly large, the number of nodules and the standard deviation of sheet resistance in a wafer tended to increase, indicating that these increases affect the properties of sputtering targets. However, Examples 21–26 are included in the scope of the present invention and had no problems.

In Examples 23–25 in which diamond-finishing machining was preformed, the center line average roughness (Ra) was 0.03–0.15 μm, the amount of contaminants was 30–130 ppm, and the thickness of a surface damage layer was 5–10 μm and thus the center line average roughness (Ra) and the thickness of a surface damage layer were remarkably reduced.

In addition, in this case, the number of nodules produced and average particle number were small and the standard deviation of sheet resistance in a wafer at the time of cumulative input power after initiation of use being 10 kWh was constantly low, 2.4–2.8%.

From the above, diamond-finishing machining is found to provide excellent results, as in Examples 5–7.

In Examples 24 and 25, as shown in Table 10, in addition to diamond-finishing machining, wet polishing and washing or chemical polishing, washing, and dehydrogenation treatment were conducted. The number of nodules and average particle number, and the standard deviation of sheet resistance in a wafer were further improved, showing excellent results.

On the contrary, in Comparative Examples 7 and 8, as shown in Table 12, the number of nodules were large, 17–19/target, and the average number of appearing particles were also large, 6 and 12/wafer. In addition, the standard deviations of sheet resistance in a wafer were as high as 4.0% and 3.7%, showing clearly bad results.

From above, an Al target of the present invention is shown to be an excellent target with lower incidences of nodule production and appearance of particles, and a small standard deviation of sheet resistance in a wafer.

According to the present invention, the surface roughness of a sputtering target is controlled to make the thickness of a thin film formed on a substrate by sputtering even. The amount of contaminants depositing on a surface and the hydrogen content of the surface, and also the thickness of a surface damage layer are reduced so that excellent effects to effectively prevent nodule production and suppress appearance of particles upon sputtering are achieved.

Precision machining using a diamond turning tool can especially reduce surface roughness effectively without using wet polishing or chemical polishing conventionally required, and selection of this processing condition can reduce the center line average roughness (Ra) to 0.2 μm or less and the thickness of a surface damage layer to 15 μm or less.

By reducing the thickness of the surface damage layer as mentioned above, an excellent effect of remarkably shortening a time required for the dummy sputtering was achieved.

What is claimed is:

1. A sputtering target comprising a surface to be eroded having a surface roughness of 1.0 μm or less in terms of center line average roughness (Ra), wherein said surface has a total amount of deposited contaminants of 500 ppm or less, a hydrogen content of 50 ppm or less and a surface damage layer with a thickness of 50 μm or less, and wherein said target is made from at least one of a major component and an alloy component and wherein said contaminants are defined as Si, Al, Co, Ni, B and metal elements, other than said major component and alloy components, having a high melting point.

2. A sputtering target according to claim 1, wherein said surface roughness is 0.2 μm or less in terms of center line average roughness (Ra) and wherein said thickness of said surface damage layer of said surface to be eroded is 15 μm or less.

3. A sputtering target according to claim 1, wherein said total amount of contaminants is 300 ppm or less.

4. A sputtering target according to claim 2, wherein said total amount of contaminants is 300 ppm or less.

5. A sputtering target according to claim 1, wherein said hydrogen content of said surface to be eroded of the sputtering target is 30 ppm or less.

6. A sputtering target according to claim 2, wherein said hydrogen content of said surface to be eroded of the sputtering target is 30 ppm or less.

7. A sputtering target according to claim 3, wherein said hydrogen content of said surface to be eroded of the sputtering target is 30 ppm or less.

8. A sputtering target according to claim 4, wherein said hydrogen content of said surface to be eroded of the sputtering target is 30 ppm or less.

* * * * *